(12) United States Patent
Kawasaki

(10) Patent No.: US 10,868,518 B2
(45) Date of Patent: Dec. 15, 2020

(54) ELASTIC WAVE DEVICE

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 69 days.

(21) Appl. No.: 16/124,224

(22) Filed: Sep. 7, 2018

(65) Prior Publication Data
US 2019/0007019 A1 Jan. 3, 2019

Related U.S. Application Data

(63) Continuation of application No. PCT/JP2017/002348, filed on Jan. 24, 2017.

(30) Foreign Application Priority Data

Mar. 8, 2016 (JP) .................. 2016-044126

(51) Int. Cl.
*H03H 9/70* (2006.01)
*H04B 1/04* (2006.01)
(Continued)

(52) U.S. Cl.
CPC .............. *H03H 9/70* (2013.01); *H03H 7/38* (2013.01); *H03H 7/465* (2013.01);
(Continued)

(58) Field of Classification Search
CPC ...... H03H 7/0153; H03H 7/383; H03H 7/463; H03H 2007/386; H03H 9/70; H03H 9/703;
(Continued)

(56) References Cited

U.S. PATENT DOCUMENTS 8,390,396 B2 * 3/2013 Furutani .............. H03H 9/0004
333/126
2006/0022767 A1 2/2006 Taniguchi et al.
(Continued)

FOREIGN PATENT DOCUMENTS

JP 2001-308538 A 11/2001
JP 2005-183890 A 7/2005
(Continued)

OTHER PUBLICATIONS

Official Communication issued in International Patent Application No. PCT/JP2017/002348, dated Mar. 28, 2017.
(Continued)

*Primary Examiner* — Barbara Summons
(74) *Attorney, Agent, or Firm* — Keating & Bennett, LLP

(57) ABSTRACT

An elastic wave device includes an impedance matching element, a switch that switches a connection state between a first switch terminal connected to the impedance matching element and second switch terminals, multiplexers connected to the second switch terminals, a substrate, and at least one inductor on the substrate and has an inductance smaller than an inductance of the impedance matching element. At least one of the second switch terminals and at least one of the multiplexers are connected with the first inductor interposed therebetween.

22 Claims, 7 Drawing Sheets

(51) Int. Cl.
    *H04B 1/00*           (2006.01)
    *H04B 1/18*           (2006.01)
    *H03H 9/72*           (2006.01)
    *H03H 9/05*           (2006.01)
    *H03H 7/38*           (2006.01)
    *H03H 7/46*           (2006.01)

(52) U.S. Cl.
    CPC ............ *H03H 9/0561* (2013.01); *H03H 9/72* (2013.01); *H04B 1/006* (2013.01); *H04B 1/0057* (2013.01); *H04B 1/0458* (2013.01); *H04B 1/18* (2013.01)

(58) Field of Classification Search
    CPC ............... H03H 9/72; H03H 9/0004; H03H 2009/0019; H03H 9/0542; H03H 9/0547; H03H 9/0557; H03H 9/0561; H03H 9/0566; H03H 9/0571; H03H 9/0576; H03H 11/34; H03H 11/342; H03H 7/38; H03H 7/465; H04B 1/0057; H04B 1/006; H04B 1/0458; H04B 1/18
    USPC ........................................................ 333/133
    See application file for complete search history.

(56) References Cited

U.S. PATENT DOCUMENTS

| | | | |
|---|---|---|---|
| 2007/0080756 A1* | 4/2007 | Aigner | H03H 9/706 333/133 |
| 2009/0067103 A1* | 3/2009 | Kijima | H04B 1/0057 361/54 |
| 2011/0109401 A1* | 5/2011 | Uejima | H03H 7/463 333/104 |
| 2012/0087282 A1* | 4/2012 | Shibahara | H03F 1/0277 370/277 |
| 2013/0141180 A1 | 6/2013 | Uejima | |
| 2013/0176916 A1 | 7/2013 | Uejima | |
| 2013/0328639 A1* | 12/2013 | Yabuuchi | H03H 9/0004 333/133 |
| 2014/0091877 A1 | 4/2014 | Uejima | |
| 2014/0167877 A1* | 6/2014 | Shimizu | H03H 7/38 333/101 |
| 2014/0321312 A1* | 10/2014 | Narahashi | H04W 24/08 370/252 |
| 2015/0133067 A1* | 5/2015 | Chang | H04B 1/006 455/78 |
| 2015/0295596 A1 | 10/2015 | Wloczysiak et al. | |
| 2017/0093552 A1* | 3/2017 | Zhang | H04B 7/04 |
| 2018/0123619 A1* | 5/2018 | Bradley | H04B 1/0057 |

FOREIGN PATENT DOCUMENTS

| | | |
|---|---|---|
| JP | 2015-204629 A | 11/2015 |
| KR | 10-2005-0073401 A | 7/2005 |
| WO | 2011/089746 A1 | 7/2011 |
| WO | 2012/014643 A1 | 2/2012 |
| WO | 2012/043430 A1 | 4/2012 |
| WO | 2013/002089 A1 | 1/2013 |

OTHER PUBLICATIONS

Official Communication issued in Japanese Patent Application No. 2018-504045, dated Jan. 7, 2020.

* cited by examiner

ELASTIC WAVE DEVICE

CROSS REFERENCE TO RELATED APPLICATIONS

This application claims the benefit of priority to Japanese Patent Application No. 2016-044126 filed on Mar. 8, 2016 and is a Continuation Application of PCT Application No. PCT/JP2017/002348 filed on Jan. 24, 2017. The entire contents of each application are hereby incorporated herein by reference.

BACKGROUND OF THE INVENTION

1. Field of the Invention

The present invention relates to an elastic wave device.

2. Description of the Related Art

Conventionally, various elastic wave devices in which a common antenna transmits and receives a plurality of communication signals using different frequency bands have been suggested.

In International Publication No. WO 2012/043430, an example of an elastic wave device that includes a plurality of duplexers is disclosed. The elastic wave device includes a switch for switching a state of connection between an antenna and a plurality of duplexers. A matching circuit is connected between the antenna and the switch. A surface-mount inductor element to improve impedance matching is connected between the switch and each of the duplexers.

In the elastic wave device according to International Publication No. WO 2012/043430, a surface-mount inductor element is connected between the switch and each of the duplexers. Therefore, it has been difficult to reduce the size of the elastic wave device. For a reduction in size, even if the surface-mount inductor elements are replaced with wiring patterns provided on a mount board, a Q value degrades, and a filter characteristic deteriorates.

SUMMARY OF THE INVENTION

Preferred embodiments of the present invention provide elastic wave devices in each of which the size is able to be reduced without deteriorating a filter characteristic.

An elastic wave device according to a preferred embodiment of the present invention includes an impedance matching element that includes a first end and a second end; a switch that includes a first switch terminal connected to the second end of the impedance matching element and a plurality of second switch terminals and that switches a state of connection between the first switch terminal and the plurality of second switch terminals; a plurality of multiplexers that are connected to the plurality of second switch terminals respectively; a substrate; and at least one inductor that is provided on the substrate and has an inductance smaller than an inductance of the impedance matching element. At least one of the second switch terminals and at least one of the multiplexers are connected with the inductor interposed therebetween.

In an elastic wave device according to a preferred embodiment of the present invention, the switch includes at least one capacitor that is connected between the first switch terminal and at least one of the multiplexers. In this case, a further reduction in size is able to be achieved.

An elastic wave device according to a preferred embodiment of the present invention includes an impedance matching element that includes a first end and a second end; a switch that includes a first switch terminal connected to the second end of the impedance matching element and a plurality of second switch terminals and that switches a state of connection between the first switch terminal and the plurality of second switch terminals; and a plurality of multiplexers that are connected to the plurality of second switch terminals respectively. The switch includes at least one capacitor that is connected between the first switch terminal and at least one of the multiplexers.

An elastic wave device according to a preferred embodiment of the present invention further includes a substrate; and at least one inductor that is provided on the substrate and has an inductance smaller than an inductance of the impedance matching element. At least one of the second switch terminals and at least one of the multiplexers are connected with the inductor interposed therebetween. In this case, a further reduction in size is able to be achieved.

In an elastic wave device according to a preferred embodiment of the present invention, at least one of the at least one inductor is a first inductor including a wiring pattern provided on the substrate. In this case, a further reduction in size is able to be achieved.

In an elastic wave device according to a preferred embodiment of the present invention, the first inductor is defined by a wiring pattern having a length longer than a distance between the second switch terminal and the multiplexer to which the first inductor is connected. In this case, a reduction in size is able to be effectively achieved.

In an elastic wave device according to a preferred embodiment of the present invention, the first inductor includes a wiring pattern having a meandering shape.

An elastic wave device according to a preferred embodiment of the present invention further includes at least one substrate laminated on the substrate. The first inductor includes a wiring pattern portion that includes a wiring pattern provided at the substrate and the substrate and a via electrode portion that is connected to the wiring pattern portion and penetrates through the substrate.

In an elastic wave device according to a preferred embodiment of the present invention, the first inductor includes a wiring pattern having a spiral shape that is provided at least one of the substrate and the substrate.

In an elastic wave device according to a preferred embodiment of the present invention, at least one of the at least one inductor is a second inductor, which is a surface-mount inductor component, and at least one of the multiplexers is connected to the impedance matching element without the second inductor interposed therebetween. In this case, a Q value is able to be increased.

In an elastic wave device according to a preferred embodiment of the present invention, the impedance matching element, the switch, the inductor, and the plurality of multiplexers are provided on the substrate. In this case, a further reduction in size is able to be achieved.

An elastic wave device according to a preferred embodiment of the present invention further includes a substrate. The impedance matching element, the switch, and the plurality of multiplexers are provided on the substrate. In this case, a further reduction in size is able to be achieved.

In an elastic wave device according to a preferred embodiment of the present invention, at least one of the second switch terminals and at least one of the multiplexers are connected with a capacitor interposed therebetween.

In an elastic wave device according to a preferred embodiment of the present invention, at least one of an inductor and a capacitor is connected between at least one of the second switch terminals and at least one of the multiplexers, and a ground potential.

In an elastic wave device according to a preferred embodiment of the present invention, the impedance matching element and the switch are connected with at least one of an inductor and a capacitor interposed therebetween.

In an elastic wave device according to a preferred embodiment of the present invention, at least one of an inductor and a capacitor is connected between the impedance matching element and the switch, and a ground potential.

In an elastic wave device according to a preferred embodiment of the present invention, in the switch, the first switch terminal is to be connected to one of the second switch terminals.

In an elastic wave device according to a preferred embodiment of the present invention, in the switch, the first switch terminal is to be connected to the plurality of second switch terminals.

In an elastic wave device according to a preferred embodiment of the present invention, the first end of the impedance matching element is to be connected to an antenna.

In an elastic wave device according to a preferred embodiment of the present invention, the impedance matching element is to be connected between the antenna and the first switch terminal.

In an elastic wave device according to a preferred embodiment of the present invention, the first end of the impedance matching element is to be connected to an amplifier.

In an elastic wave device according to a preferred embodiment of the present invention, the impedance matching element is to be connected between the amplifier and the first switch terminal.

A reduction in size of elastic wave devices according to preferred embodiments of the present invention is able to be achieved without deteriorating a filter characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to drawings.

It should be noted that individual preferred embodiments and modifications thereof described herein are merely examples and configurations in different preferred embodiments may be partially replaced or combined with each other.

Figure 1:
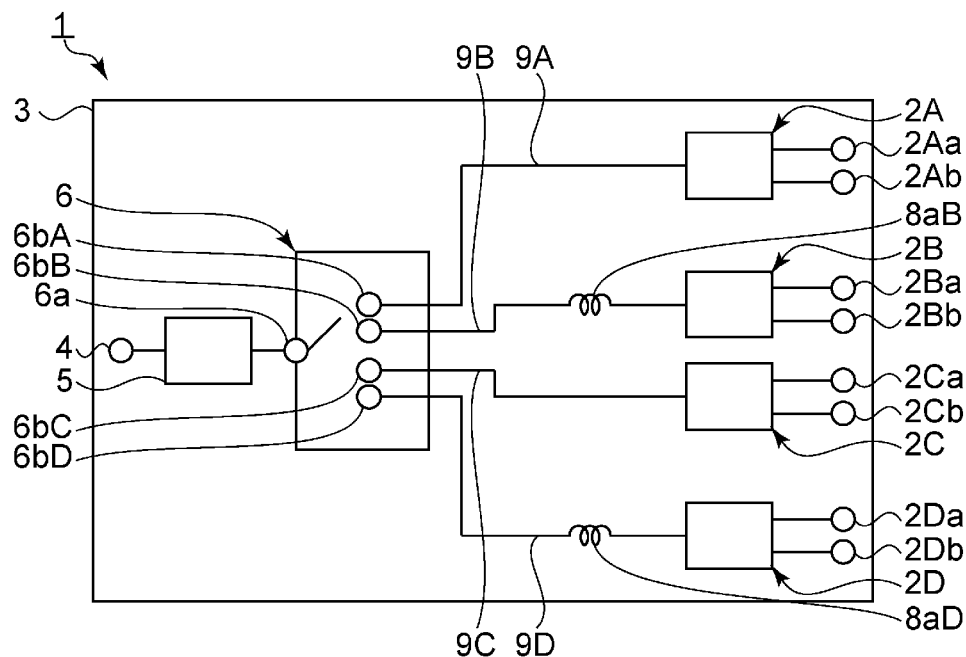
FIG. 1 is a schematic diagram of an elastic wave device according to a first preferred embodiment of the present invention.
Figure 2:
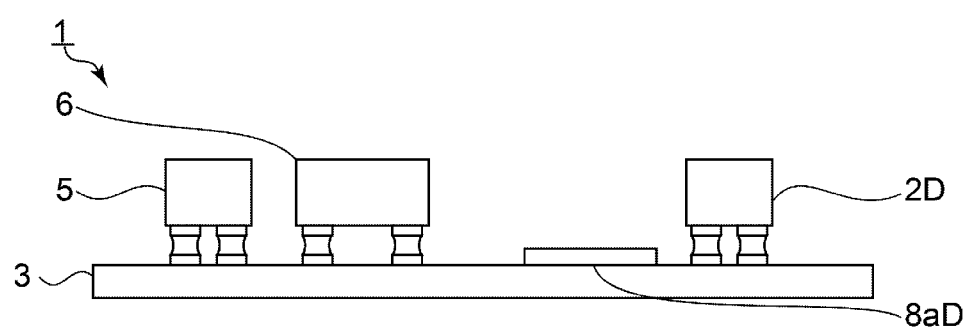
FIG. 2 is a schematic front view of the elastic wave device according to the first preferred embodiment of the present invention.

FIG. 1 is a schematic diagram of an elastic wave device according to a first preferred embodiment of the present invention. FIG. 2 is a schematic front view of the elastic wave device according to the first preferred embodiment.

As illustrated in FIG. 1, an elastic wave device 1 includes a mount board 3 defining a substrate. On the mount board 3, first to fourth duplexers 2A to 2D are provided. The first to fourth duplexers 2A to 2D each include a reception filter and a transmission filter. For example, the first to fourth duplexers 2A to 2D are preferably used for different Bands for a cellular phone.

The first duplexer 2A includes an input terminal 2Aa and an output terminal 2Ab. The input terminal 2Aa is a transmission terminal, and the output terminal 2Ab is a reception terminal. In a similar manner, the second to fourth duplexers 2B to 2D include input terminals 2Ba to 2Da and output terminals 2Bb to 2Db, respectively.

The elastic wave device 1 includes a terminal 4. In the present preferred embodiment, the terminal 4 is an antenna terminal that is connected to an antenna. The terminal 4 is connected to an impedance matching element 5, which is a surface-mount (SMD) inductor, for example. More specifically, the impedance matching element 5 includes a first end and a second end. The terminal 4 is connected to the first end of the impedance matching element 5. As illustrated in FIG. 2, the impedance matching element 5 is preferably a chip component, for example. The impedance matching element 5 is mounted on the mount board 3 by, for example, soldering.

Referring back to FIG. 1, the second end of the impedance matching element 5 is connected to a switch 6. The switch 6 includes a first switch terminal 6a and a plurality of second switch terminals 6bA to 6bD. The first switch terminal 6a is connected to the impedance matching element 5.

The plurality of second switch terminals 6bA to 6bD are connected to the first to fourth duplexers 2A to 2D through first to fourth wires 9A to 9D, respectively. In the present preferred embodiment, the terminal 4, the impedance matching element 5, the switch 6, the first to fourth wires 9A to 9D, and the first to fourth duplexers 2A to 2D are provided on the mount board 3.

The elastic wave device 1 includes first inductors 8aB and 8aD. The first inductor 8aB is provided on the second wire 9B. The first inductor 8aD is provided on the fourth wire 9D. An inductance of each of the first inductors 8aB and 8aD is preferably smaller than an inductance of the impedance matching element 5. The first inductors 8aB and 8aD are defined by wiring patterns provided on the mount board 3. In this specification, for example, a state in which the first inductor 8aB is provided on the second wire 9B represents a state in which the second switch terminal 6bB and the duplexer 2B are connected with the first inductor 8aB interposed therebetween.

The impedance matching element 5 and the first inductors 8aB and 8aD perform impedance matching of the first to fourth duplexers 2A to 2D on an antenna side. In the present preferred embodiment, no inductor is connected on the first and third wires 9A and 9C.

The present preferred embodiment includes the following configurations: 1) the impedance matching element 5, which is a surface-mount inductor component, is connected between the terminal 4 and the switch 6; and 2) the first inductors 8aB and 8aD each having an inductance smaller than that of the impedance matching element 5 and each defined by a wiring pattern are provided on the second and fourth wires 9B and 9D, respectively. Therefore, a reduction in the size of the elastic wave device 1 is able to be achieved without deteriorating a filter characteristic. This will be explained in detail below.

In the first duplexer 2A in the present preferred embodiment, preferably, an inductance of about 8 nH, for example, is provided to achieve impedance matching. In the second duplexer 2B, an inductance of about 10 nH, for example, is provided to achieve impedance matching. In the third and fourth duplexers 2C and 2D, inductances of about 8 nH and about 9 nH, for example, are provided to achieve impedance matching, respectively. These values are merely examples, and the inductances are not particularly limited to these values.

The impedance matching element 5 is connected to the first to fourth duplexers 2A to 2D with the switch 6 interposed therebetween. The impedance matching element 5 is common for the first to fourth duplexers 2A to 2D. The inductance of the impedance matching element 5 is preferably about 8 nH, which is equal or substantially equal to a value required to match impedance by each of the first and third duplexers 2A and 2C. Therefore, the first and third duplexers 2A and 2C achieve excellent impedance matching, even without being connected to an inductor in addition to the impedance matching element 5.

The inductances of the first inductors 8aB and 8aD are preferably, for example, about 2 nH and about 1 nH, respectively. The second duplexer 2B is connected to the impedance matching element 5 with the first inductor 8aB interposed therebetween. The fourth duplexer 2D is connected to the impedance matching element 5 with the first inductor 8aD interposed therebetween. Thus, the second and fourth duplexers 2B and 2D achieve excellent impedance matching.

Now, the present preferred embodiment will be compared to comparative examples 1 and 2.

Figure 3:
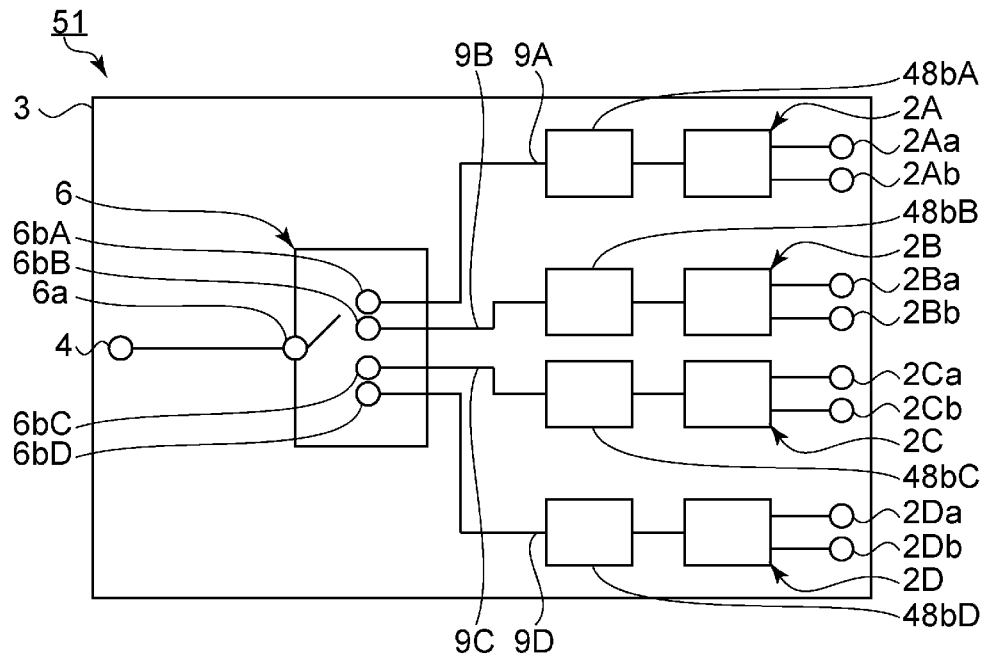
FIG. 3 is a schematic diagram of an elastic wave device according to a comparative example 1.

FIG. 3 is a schematic diagram of an elastic wave device according to the comparative example 1.

An elastic wave device 51 according to the comparative example 1 is different from the first preferred embodiment in that no impedance matching element is connected between the terminal 4 and the switch 6. In the elastic wave device 51, second inductors 48bA to 48bD are connected between the switch 6 and all of the first to fourth duplexers 2A to 2D, respectively. The elastic wave device 51 is also different from the first preferred embodiment in this feature.

The second inductors 48bA to 48bD are surface-mount inductor components. Therefore, the second inductors 48bA to 48bD are larger than inductors defined by wiring patterns provided on the mount board 3. The number of such second inductors 48bA to 48bD is the same as the number of the first to fourth duplexers 2A to 2D, and therefore, it is difficult to reduce the size of the elastic wave device 51.

In contrast, in the present preferred embodiment illustrated in FIG. 1, each of the inductors other than the impedance matching element 5 is defined by a wiring pattern provided on the mount board 3. In addition, no inductor is connected between the first and third duplexers 2A and 2C and the switch 6. Therefore, a reduction in the size of an elastic wave device is able to be achieved without deteriorating a filter characteristic, such as impedance matching.

Figure 4:
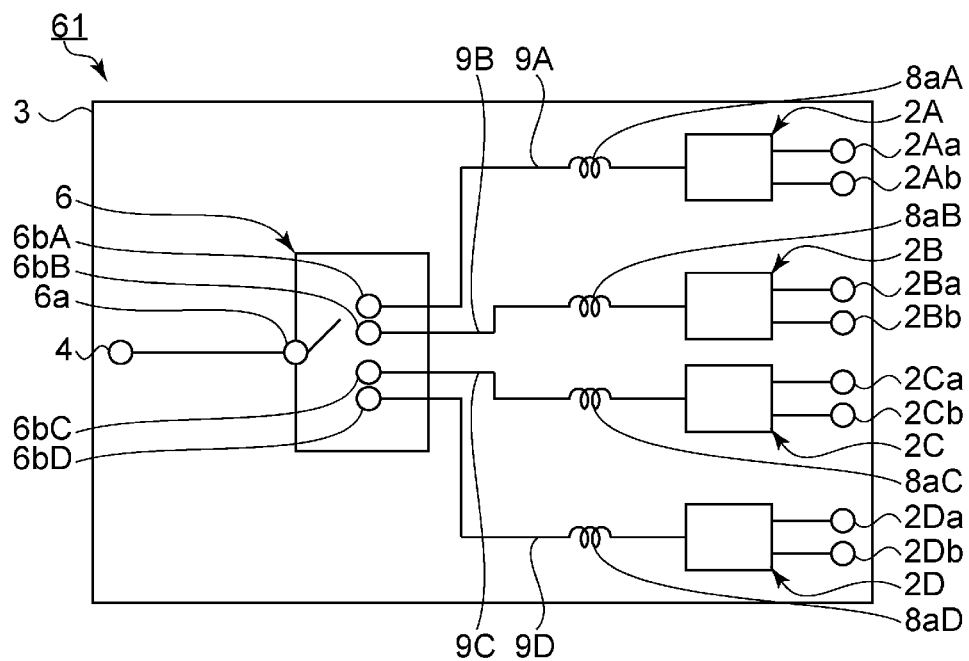
FIG. 4 is a schematic diagram of an elastic wave device according to a comparative example 2.

FIG. 4 is a schematic diagram of an elastic wave device according to the comparative example 2.

An elastic wave device 61 according to the comparative example 2 is different from the first preferred embodiment in that no impedance matching element is connected between the terminal 4 and the switch 6. In the elastic wave device 61, first inductors 8aA to 8aD are connected between the switch 6 and all of the first to fourth duplexers 2A to 2D, respectively. The elastic wave device 61 is also different from the first preferred embodiment in this feature.

In the elastic wave device 61, impedance matching of the first to fourth duplexers 2A to 2D is performed only by the first inductors 8aA to 8aD defined by wiring patterns provided on the mount board 3. Therefore, a Q value degrades, and a filter characteristic deteriorates.

In contrast, the elastic wave device 1 according to the present preferred embodiment illustrated in FIG. 1 includes the impedance matching element 5, which is a surface-mount inductor component and has a high Q value. Furthermore, in the present preferred embodiment, the inductance of each of the first inductors 8aB and 8aD is preferably smaller than the inductance of the impedance matching element 5. Therefore, a reduction in the size of the elastic wave device 1 is able to be achieved, without causing a deterioration of a filter characteristic, which is brought about by a degradation of a Q value.

In addition, in the first and third duplexers 2A and 2C, impedance matching is performed only by the impedance matching element 5. Therefore, a filter characteristic is even less likely to deteriorate.

The elastic wave device 1 only needs to include at least one first inductor. For example, a first inductor may be provided on each of the first to fourth wires 9A to 9D.

As described above, in the present preferred embodiment, the terminal 4, the impedance matching element 5, the switch 6, the first to fourth wires 9A to 9D, the first inductors 8aB and 8aD, and the first to fourth duplexers 2A to 2D are preferably provided on the mount board 3. These elements may be provided on different substrates. In this case, only at least a portion of the first to fourth wires 9A to 9D is preferably provided on a substrate on which the first inductors 8aB and 8aD are provided.

Figure 5:
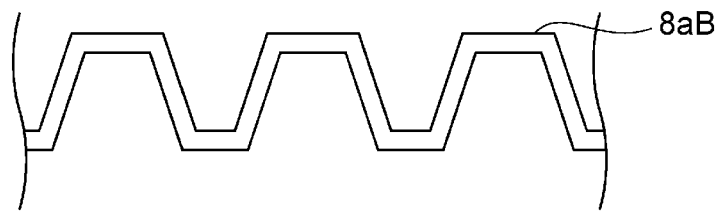
FIG. 5 is a schematic plan view illustrating an example of a shape of a wiring pattern of a first inductor in the first preferred embodiment of the present invention.

As described above, in the present preferred embodiment, the first inductors 8aB and 8aD are defined by wiring patterns provided on the mount board 3. More specifically, the first inductor 8aB is preferably defined by a wiring pattern that is longer than the distance between the second switch terminal 6bB and the duplexer 2B that are connected to the first inductor 8aB. The first inductor 8aD is preferably configured in a similar manner. FIG. 5, which will be described below, illustrates an example of a wiring pattern defining the first inductor 8aB.

FIG. 5 is a schematic plan view illustrating an example of a shape of a wiring pattern of a first inductor in the first preferred embodiment.

As illustrated in FIG. 5, the first inductor 8aB may include a wiring pattern having a meandering shape. Accordingly, the impedance of the first inductor 8aB may be increased. If less impedance is required, the first inductor 8aB may be defined by a wiring pattern that does not include a meandering shape or a similar shape and is longer than the distance between the second switch terminal and the duplexer. In this case, for example, the first inductor 8aB may preferably be defined by a wiring pattern including a bent portion.

A first inductor may be three-dimensional. This example will be described below.

Figure 6:
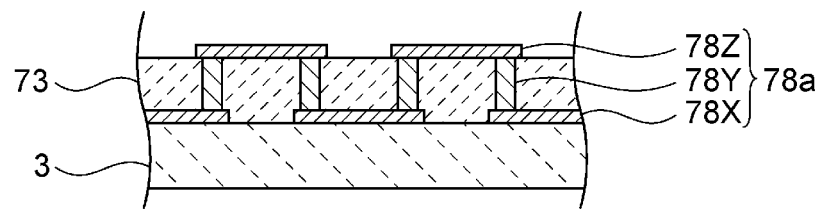
FIG. 6 is a schematic cross-sectional view of a portion near a first inductor in a first modification of the first preferred embodiment of the present invention.
Figure 7:
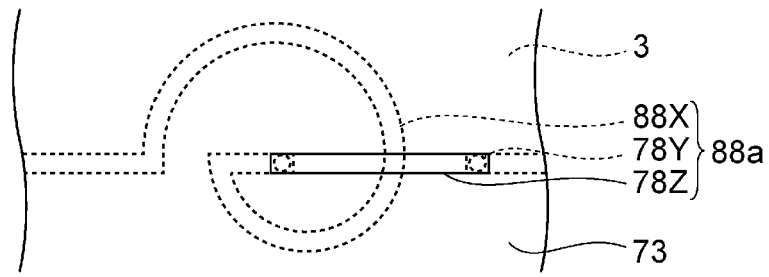
FIG. 7 is a schematic plan view of a portion near a first inductor in a second modification of the first preferred embodiment of the present invention.

FIG. 6 is a schematic cross-sectional view of a portion near a first inductor in a first modification of the first preferred embodiment. FIG. 7 is a schematic plan view of a portion near a first inductor in a second modification of the first preferred embodiment.

As illustrated in FIG. 6, in the first modification, an elastic wave device includes a substrate 73 that is laminated on the mount board 3. A first inductor 78a includes a plurality of wiring pattern portions 78X provided at the mount board 3 and a plurality of wiring pattern provided 78Z provided at the substrate 73. The first inductor 78a includes a plurality of via electrode portions 78Y penetrating through the substrate 73. The wiring pattern portions 78X at the mount board 3 and the wiring pattern portions 78Z at the substrate 73 are connected through the via electrode portions 78Y. More specifically, in the first modification, areas near end portions of the wiring pattern portions 78X at the mount board 3 and areas near end portions of the wiring pattern portions 78Z at the substrate 73 are connected through the via electrode portions 78Y. Accordingly, the cross-sectional shape of the first inductor 78a illustrated in FIG. 6 is a meandering shape.

In the case in which the first inductor 78a is three-dimensional, only at least one wiring pattern portion 78Z needs to be provided at the substrate 73. The elastic wave device may include a plurality of substrates 73. In this case, the plurality of substrates 73 may be laminated.

As illustrated in FIG. 7, in the second modification, a wiring pattern portion 88X at the mount board 3 has a spiral shape. In a first inductor 88a, a wiring pattern portion 78Z provided at the substrate 73 may have a spiral shape. Alternatively, in the case in which an elastic wave device includes a plurality of substrates 73, a plurality of wiring pattern portions 78Z may be connected through via electrode portions 78Y, so that the spiral shape may be three-dimensional.

Figure 8:
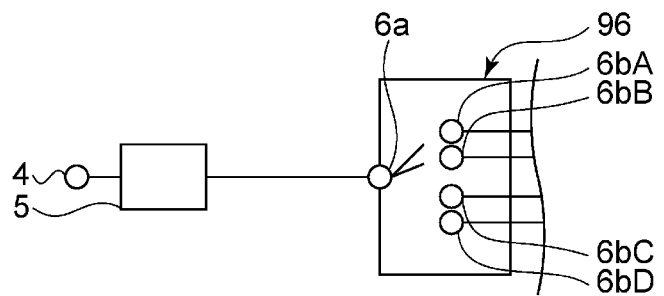
FIG. 8 is a schematic diagram illustrating a portion near an impedance matching element and a switch in a third modification of the first preferred embodiment of the present invention.

Referring back to FIG. 1, in the present preferred embodiment, in the switch 6, the first switch terminal 6a is connected to one of the plurality of second switch terminals 6bA to 6bD. In contrast, in a third modification of the first preferred embodiment illustrated in FIG. 8, in a switch 96, the first switch terminal 6a is connected to two second switch terminals, for example. As described above, in the switch 6, the first switch terminal 6a may be connected to two or more second switch terminals.

Also in fourth to seventh modifications of the first preferred embodiment illustrated in FIGS. 9 to 12, a reduction in size is able to be achieved without deteriorating a filter characteristic, as in the first preferred embodiment. In FIGS. 9 to 12, a capacitor and a ground potential, which will be described later, are represented by circuit symbols.

Figure 9:
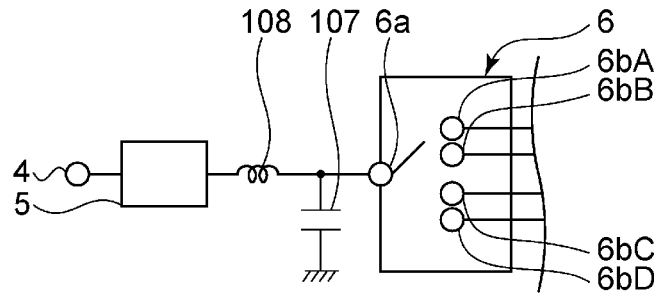
FIG. 9 is a schematic diagram illustrating a portion near an impedance matching element and a switch in a fourth modification of the first preferred embodiment of the present invention.

In the fourth modification illustrated in FIG. 9, the impedance matching element 5 and the switch 6 are connected with an inductor 108 interposed therebetween. Furthermore, a capacitor 107 is connected between the impedance matching element 5 and the switch 6, and a ground potential.

In the fourth modification, the inductor 108 is defined by a wiring pattern provided on the mount board 3, as with the first inductor. The inductor 108 may be three-dimensional or may be a surface-mount inductor component, as in the first to third modifications described above. However, it is preferable that the inductor 108 is defined by a wiring pattern provided on the mount board 3. In this case, a reduction in the size of the elastic wave device is able to be effectively achieved.

Figure 10:
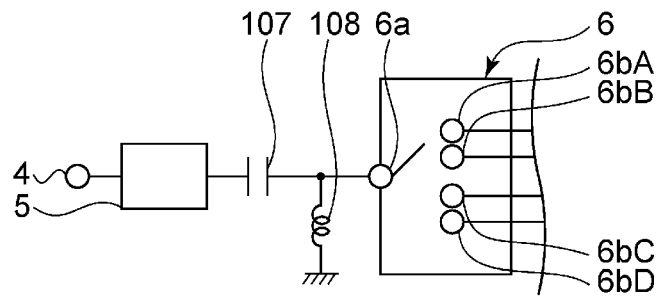
FIG. 10 is a schematic diagram illustrating a portion near an impedance matching element and a switch in a fifth modification of the first preferred embodiment of the present invention.

In the fifth modification illustrated in FIG. 10, the impedance matching element 5 and the switch 6 are connected with the capacitor 107 interposed therebetween. Furthermore, the inductor 108 is connected between the impedance matching element 5 and the switch 6, and the ground potential.

As in the fourth modification and the fifth modification, at least one of the inductor 108 and the capacitor 107 may be connected between the impedance matching element 5 and the switch 6. At least one of the inductor 108 and the capacitor 107 may be connected between the impedance matching element 5 and the switch 6, and the ground potential.

Figure 11:
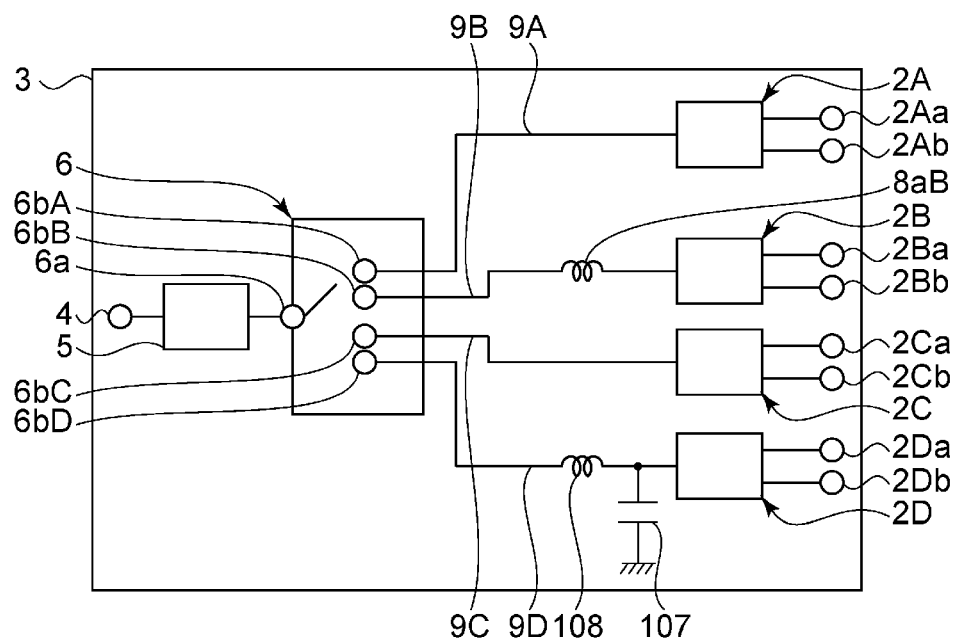
FIG. 11 is a schematic diagram of an elastic wave device according to a sixth modification of the first preferred embodiment of the present invention.

In the sixth modification illustrated in FIG. 11, the second switch terminal 6bD and the duplexer 2D are connected with the inductor 108 interposed therebetween. Furthermore, the capacitor 107 is connected between the second switch terminal 6bD and the duplexer 2D, and the ground potential.

Figure 12:
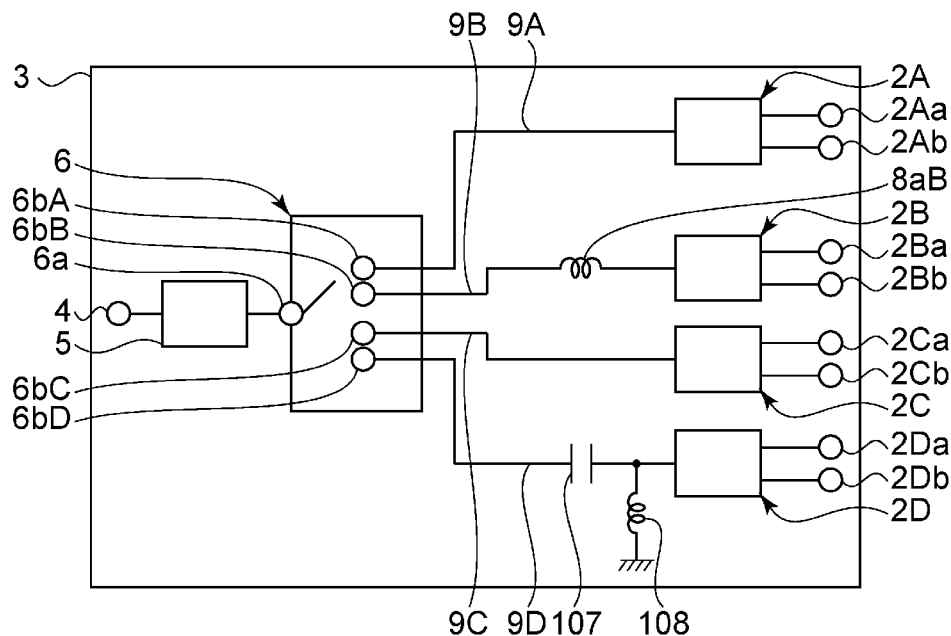
FIG. 12 is a schematic diagram of an elastic wave device according to a seventh modification of the first preferred embodiment of the present invention.

In the seventh modification illustrated in FIG. 12, the second switch terminal 6bD and the duplexer 2D are connected with the capacitor 107 interposed therebetween. Furthermore, the inductor 108 is connected between the second switch terminal 6bD and the duplexer 2D, and the ground potential.

As in the sixth modification illustrated in FIG. 11, at least one of the second switch terminals that is not connected to the first inductor and at least one of the duplexers that is not connected to the first inductor may be connected with the inductor 108 interposed therebetween. As in the seventh modification illustrated in FIG. 12, at least one of the second switch terminals and at least one of the duplexers may be connected with the capacitor 107 interposed therebetween. In the seventh modification, the capacitor 107 is connected between the second switch terminal 6bD and the duplexer 2D that are not connected to the first inductor.

As in the sixth modification and the seventh modification, at least one of the inductor 108 and the capacitor 107 may be connected between at least one second switch terminal and at least one multiplexer, and the ground potential. In this case, the inductor 108 only needs to be connected between the second switch terminal and the duplexer that are not connected to the first inductor and the ground potential.

As described above, the elastic wave device 1 according to the present preferred embodiment illustrated in FIG. 1 includes the first to fourth duplexers 2A to 2D. The elastic wave device 1 may include, for example, a multiplexer to which an antenna end of the first duplexer 2A and an antenna end of the second duplexer 2B are connected. In this case, the antenna ends of the first duplexer 2A and the second duplexer 2B may be connected in common to the first inductor 8aB.

In the elastic wave device 1, the impedance on an antenna end side of each of the first to fourth duplexers 2A to 2D may preferably be about 50Ω or a value different from about 50Ω, for example. In a similar manner, the impedance on the input terminals 2Aa to 2Da side and on the output terminals 2Ab to 2Db side of the duplexers 2A to 2D may each preferably be about 50Ω or a value different from about 50Ω, for example. In any of the present preferred embodiment and the modifications thereto described above, excellent impedance matching is able to be achieved.

Figure 13:
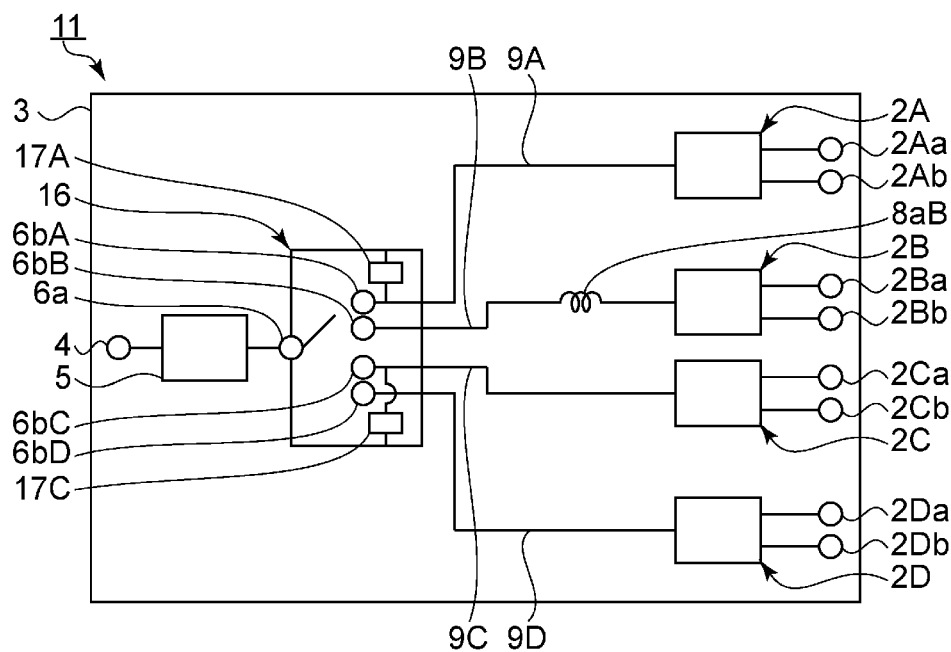
FIG. 13 is a schematic diagram of an elastic wave device according to a second preferred embodiment of the present invention.

FIG. 13 is a schematic diagram of an elastic wave device according to a second preferred embodiment of the present invention.

An elastic wave device 11 according to the second preferred embodiment is different from the first preferred embodiment in a switch 16 including capacitors 17A and 17C and the number of first inductors. The inductance of the impedance matching element 5 is also different from the first preferred embodiment. Apart from the above-described features, the elastic wave device 11 has a configuration the same as or similar to that of the elastic wave device 1 according to the first preferred embodiment.

The capacitor 17A is connected between a second switch terminal 6bA of the switch 16 and the first duplexer 2A. The capacitor 17C is connected between a second switch terminal 6bC of the switch 16 and the third duplexer 2C. The first inductor 8aB is provided only on the second wire 9B out of the first to fourth wires 9A to 9D.

In the present preferred embodiment, the inductance of the impedance matching element 5 is preferably about 9 nH, for example. The capacitance of the capacitor 17A preferably corresponds to about −1 nH, for example. The capacitance of the capacitor 17C preferably corresponds to about −1 nH, for example. The inductance of the first inductor 8aB is preferably about 1 nH, for example. The inductances provided to achieve impedance matching by the first to fourth duplexers 2A to 2D are the same or substantially the same as those in the first preferred embodiment.

The first duplexer 2A is connected to the impedance matching element 5 with the capacitor 17A interposed therebetween. Therefore, excellent impedance matching is able to be achieved. In a similar manner, the second and third duplexers 2B and 2C are connected to the impedance matching element 5 with the first inductor 8aB and the capacitor 17C interposed therebetween, respectively. Therefore, excellent impedance matching is able to be achieved.

Also in this case, a reduction in the size of the elastic wave device 11 is able to be achieved without deteriorating a filter characteristic.

The switch 16 only needs to include at least one capacitor.

Figure 14:
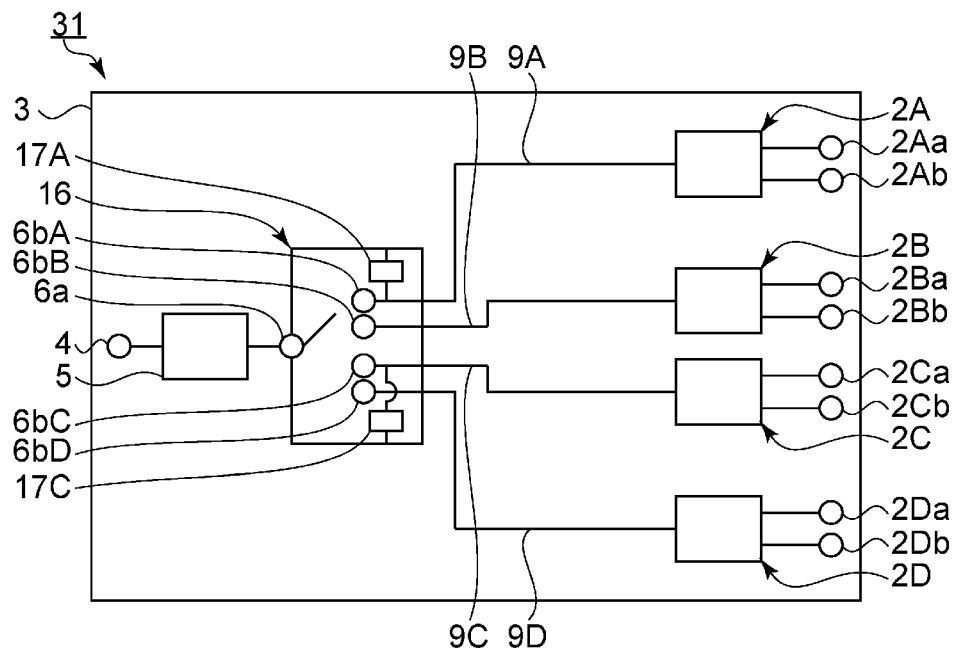
FIG. 14 is a schematic diagram of an elastic wave device according to a first modification of the second preferred embodiment of the present invention.

With the inductances provided to achieve impedance matching by the first to fourth duplexers 2A to 2D, the inductance of the impedance matching element 5, and the capacitances of the capacitors 17A and 17C, a configuration according to a first modification of the second preferred embodiment illustrated in FIG. 14 may preferably be provided. Alternatively, a configuration according to a second modification of the second preferred embodiment illustrated in FIG. 15 may preferably be provided.

In an elastic wave device 31 according to the first modification of the second preferred embodiment illustrated in FIG. 14, no inductor other than the impedance matching element 5 is provided. As in the second preferred embodiment, the switch 16 includes the capacitors 17A and 17C.

Figure 15:
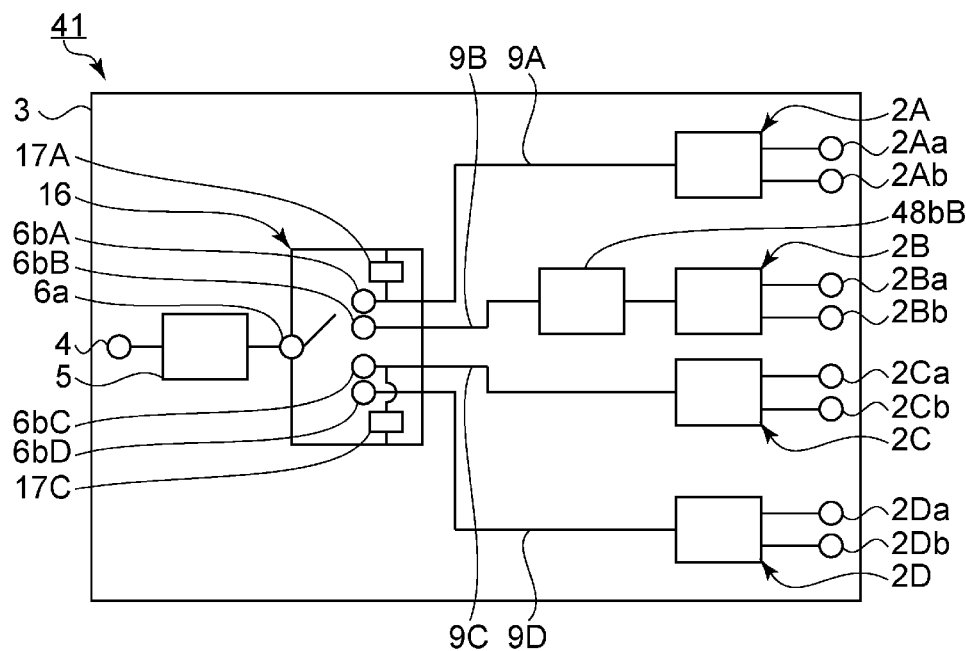
FIG. 15 is a schematic diagram of an elastic wave device according to a second modification of the second preferred embodiment of the present invention.

In the second modification of the second preferred embodiment illustrated in FIG. 15, an inductor provided on the second wire 9B is a second inductor 48bB, which is a surface-mount inductor component. A plurality of second inductors may be provided. In this case, at least one duplexer only needs to be connected to the impedance matching element 5 with no second inductor interposed therebetween. Also in this case, the number of surface-mount inductor components may be reduced, and a reduction in the size of an elastic wave device 41 is thus able to be achieved. In addition, a Q value is also able to be increased.

Figure 16:
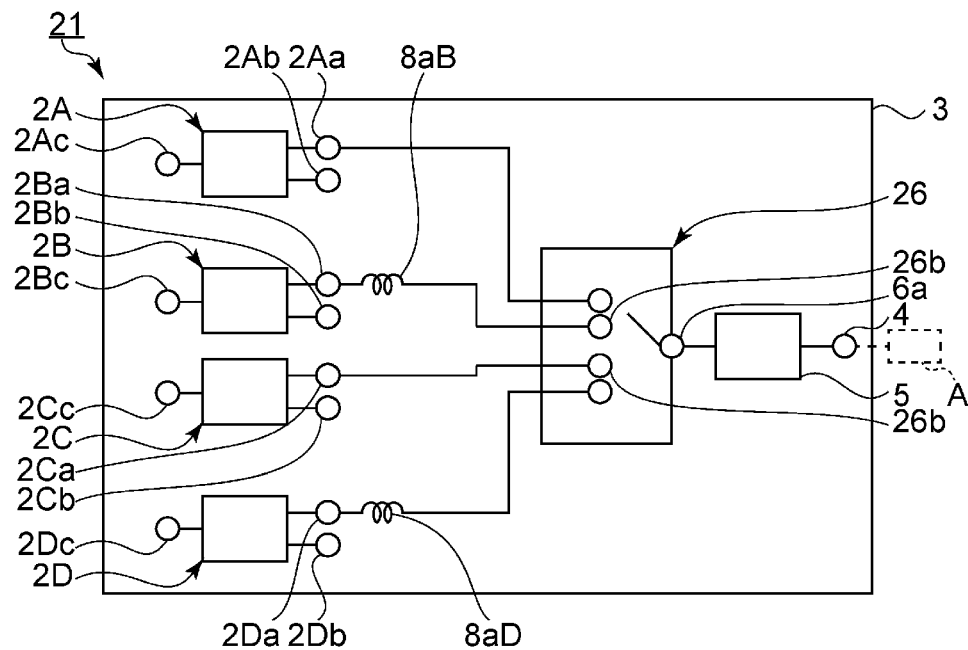
FIG. 16 is a schematic diagram of an elastic wave device according to a third preferred embodiment of the present invention.

FIG. 16 is a schematic diagram of an elastic wave device according to a third preferred embodiment of the present invention.

In an elastic wave device 21, the terminal 4 is connected to an amplifier A, which is represented by a broken line, instead of an antenna. One end of the impedance matching element 5 is connected to the amplifier A with the terminal 4 interposed therebetween. The input terminals 2Aa to 2Da, which are terminals on a transmission filter side of the first to fourth duplexers 2A to 2D, are connected to a switch 26. In contrast, the output terminals 2Ab to 2Db, which are terminals on a reception filter side, are not connected to the switch 26. The switch 26 includes a plurality of second switch terminals 26b that are connected to the input terminals 2Aa to 2Da.

In the present preferred embodiment, the impedance matching element 5 and the first inductors 8aB and 8aD perform impedance matching on the amplifier A side of the transmission filters of the first to fourth duplexers 2A to 2D.

The first duplexer 2A includes a common terminal 2Ac to which a transmission filter and a reception filter are connected in common. In a similar manner, the second to fourth duplexers 2B to 2D include common terminals 2Bc to 2Dc, respectively. The common terminals 2Ac to 2Dc are connected to an antenna. For example, the common terminals 2Ac to 2Dc may be connected to a switch that switches a state of connection between the antenna and the common terminals 2Ac to 2Dc.

Also in the present preferred embodiment, the elastic wave device 21 includes at least one first inductor that is connected between at least one duplexer and the switch 26. Therefore, a reduction in the size of the elastic wave device 21 is able to be achieved without deteriorating impedance matching.

Figure 17:
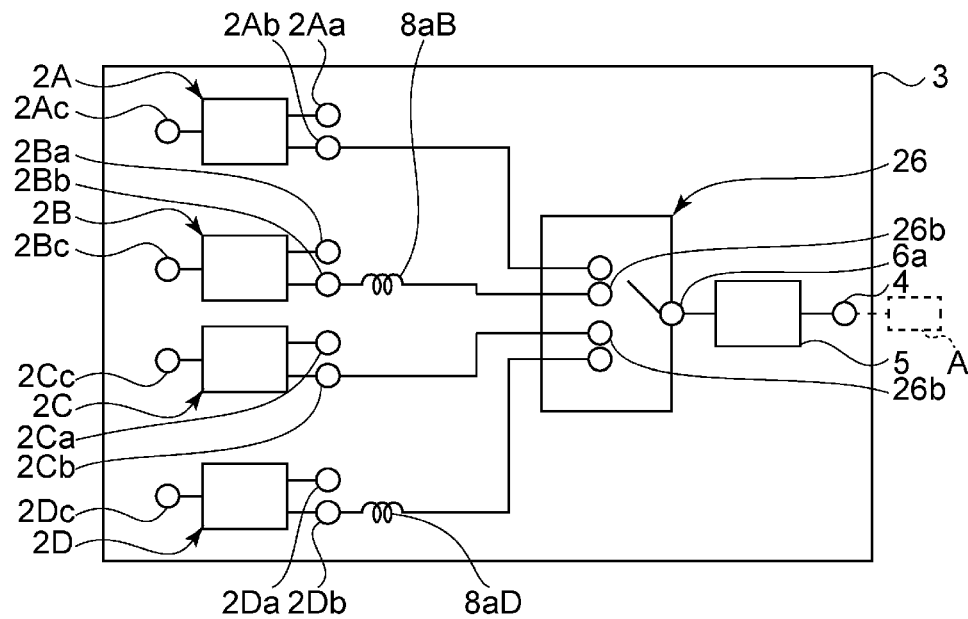
FIG. 17 is a schematic diagram of an elastic wave device according to a fourth preferred embodiment of the present invention.

FIG. 17 is a schematic diagram of an elastic wave device according to a fourth preferred embodiment of the present invention.

The present preferred embodiment is different from the third preferred embodiment in that the output terminals 2Ab to 2Db, which are terminals on a reception filter side of the first to fourth duplexers 2A to 2D, are connected to the switch 26. The input terminals 2Aa to 2Da are not connected to the switch 26. The elastic wave device according to the present preferred embodiment has a configuration the same as or similar to that of the elastic wave device 21 according to the third preferred embodiment with the exception of the above-described features.

In the present preferred embodiment, the impedance matching element 5 and the first inductors 8aB and 8aD perform impedance matching on the amplifier A side of reception filters of the first to fourth duplexers 2A to 2D.

Also in the present preferred embodiment, as in the third preferred embodiment, a reduction in the size of the elastic wave device is able to be achieved without deteriorating impedance matching.

In preferred embodiments of the present invention, a multiplexer is not limited to a duplexer. A multiplexer may be a triplexer or other suitable multiplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an impedance matching element that includes a first end and a second end;
   a switch that includes a first switch terminal connected to the second end of the impedance matching element and a plurality of second switch terminals, and that switches a state of connection between the first switch terminal and the plurality of second switch terminals;
   a plurality of multiplexers that are connected to the plurality of second switch terminals respectively;
   a substrate; and
   at least one inductor that is provided on the substrate and has an inductance smaller than an inductance of the impedance matching element; wherein
   at least one of the plurality of second switch terminals and at least one of the plurality of multiplexers are connected with the at least one inductor interposed therebetween.

2. The elastic wave device according to claim 1, wherein the switch includes at least one capacitor that is connected between at least one of the plurality of second switch terminals and at least one of the plurality of multiplexers.

3. The elastic wave device according to claim 1, wherein at least one of the at least one inductor is a first inductor including a wiring pattern provided on the substrate.

4. The elastic wave device according to claim 3, wherein the wiring pattern of the first inductor has a length longer than a distance between the second switch terminal and the multiplexer to which the first inductor is connected.

5. The elastic wave device according to claim 4, wherein the wiring pattern of the first inductor has a meandering shape.

6. The elastic wave device according to claim 3, further comprising:
   at least one second substrate laminated on the substrate; wherein
   the wiring pattern of the first inductor is provided on the substrate and the at least one second substrate, and a via electrode portion is connected to the wiring pattern and penetrates through the at least one second substrate.

7. The elastic wave device according to claim 6, wherein the wiring pattern of the first inductor includes a wiring pattern portion that has a spiral shape and is provided on at least one of the substrate and the at least one second substrate.

8. The elastic wave device according to claim 1, wherein
   at least one of the at least one inductor is a second inductor defined by a surface-mount inductor component; and
   at least one of the plurality of multiplexers is connected to the impedance matching element without the second inductor interposed therebetween.

9. The elastic wave device according to claim 1, wherein the impedance matching element, the switch, the at least one inductor, and the plurality of multiplexers are provided on the substrate.

10. The elastic wave device according to claim 1, wherein at least one of the plurality of second switch terminals and at least one of the plurality of multiplexers are connected with a capacitor interposed therebetween.

11. The elastic wave device according to claim 1, wherein at least one of an inductor and a capacitor is connected between at least one of the plurality of second switch terminals and at least one of the plurality of multiplexers, and a ground potential.

12. The elastic wave device according to claim 1, wherein the impedance matching element and the switch are connected with at least one of an inductor and a capacitor interposed therebetween.

13. The elastic wave device according to claim 1, wherein at least one of an inductor and a capacitor is connected between the impedance matching element and the switch, and a ground potential.

14. The elastic wave device according to claim 1, wherein in the switch, the first switch terminal is to be connected to one of the plurality of second switch terminals.

15. The elastic wave device according to claim 1, wherein in the switch, the first switch terminal is to be connected to the plurality of second switch terminals.

16. The elastic wave device according to claim 1, wherein the first end of the impedance matching element is to be connected to an antenna.

17. The elastic wave device according to claim 16, wherein the impedance matching element is to be connected between the antenna and the first switch terminal.

18. The elastic wave device according to claim 1, wherein the first end of the impedance matching element is to be connected to an amplifier.

19. The elastic wave device according to claim 18, wherein the impedance matching element is to be connected between the amplifier and the first switch terminal.

20. An elastic wave device comprising:
   an impedance matching element that includes a first end and a second end;
   a switch that includes a first switch terminal connected to the second end of the impedance matching element and a plurality of second switch terminals, and that switches a state of connection between the first switch terminal and the plurality of second switch terminals; and
   a plurality of multiplexers that are connected to the plurality of second switch terminals respectively; wherein the switch includes at least one capacitor that is connected between at least one of the plurality of second switch terminals and at least one of the plurality of multiplexers.

21. The elastic wave device according to claim 20, further comprising:
    a substrate; and
    at least one inductor that is provided on the substrate and has an inductance smaller than an inductance of the impedance matching element; wherein
    at least one of the plurality of second switch terminals and at least one of the plurality of multiplexers are connected with the at least one inductor interposed therebetween.

22. The elastic wave device according to claim 20, further comprising:
    a substrate;
    the impedance matching element, the switch, and the plurality of multiplexers are provided on the substrate.

* * * * *